(12) United States Patent
Park et al.

(10) Patent No.: US 12,707,576 B2
(45) Date of Patent: Aug. 11, 2026

(54) FLEXIBLE DISPLAY DEVICE

(71) Applicant: LG Display Co., Ltd., Seoul (KR)

(72) Inventors: JaeHyoung Park, Paju-si (KR); Hyesun Son, Seoul (KR); Yeonjae Jeong, Paju-si (KR); EunSoo Chang, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 236 days.

(21) Appl. No.: 18/540,506

(22) Filed: Dec. 14, 2023

(65) Prior Publication Data

US 2024/0215189 A1 Jun. 27, 2024

(30) Foreign Application Priority Data

Dec. 23, 2022 (KR) ........................ 10-2022-0182699

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01)

(58) Field of Classification Search
CPC ... H05K 5/0217; G06F 1/1652; G06F 1/1637; G06F 1/1624; G06F 1/1626; G09F 9/301
See application file for complete search history.

(56) References Cited

U.S. PATENT DOCUMENTS

| | | | | |
|---|---|---|---|---|
| 10,893,130 | B1 * | 1/2021 | Song | H04M 1/0237 |
| 10,955,876 | B1 * | 3/2021 | Song | G06F 1/1652 |
| 11,042,195 | B1 * | 6/2021 | Hong | G06F 1/1681 |
| 11,914,423 | B2 * | 2/2024 | Shin | H04M 1/0268 |
| 2013/0010405 | A1 * | 1/2013 | Rothkopf | H04M 1/0268<br>361/679.01 |
| 2018/0150102 | A1 | 5/2018 | Lee et al. | |
| 2021/0022258 | A1 | 1/2021 | Yu | |
| 2021/0165457 | A1 | 6/2021 | Tan et al. | |

FOREIGN PATENT DOCUMENTS

| | | | |
|---|---|---|---|
| CN | 108122493 | A | 6/2018 |
| CN | 115457865 | A | 12/2022 |
| KR | 10-2020-0067023 | A | 6/2020 |

* cited by examiner

*Primary Examiner* — Sagar Shrestha
(74) *Attorney, Agent, or Firm* — Birch, Stewart, Kolasch & Birch, LLP

(57) ABSTRACT

A flexible display device can include a display panel configured to display images. The display panel includes at least one folding area that is foldable about a folding axis and a non-folding area. A cover window is provided on the display panel. Aback plate supports a bottom portion of the display panel, and a support part supports the back plate in a slidable manner. Further, a first magnetic body is connected to the cover window or the back plate. A second magnetic body is also provided on the support part to attract the first magnetic body so that a portion of the second magnetic body connected to the first magnetic body is drawn from the folding area toward the non-folding area. As such, a crease that can develop in the folding area can be prevented from forming by applying tension to the display panel.

19 Claims, 16 Drawing Sheets

FLEXIBLE DISPLAY DEVICE

CROSS REFERENCE TO RELATED APPLICATION

This application claims priority from Korean Patent Application No. 10-2022-0182699, filed on Dec. 23, 2022 in the Republic of Korea, the entire disclosure of which is hereby expressly incorporated by reference for all purposes as if fully set forth herein into the present application.

BACKGROUND

Field

Embodiments of the present disclosure relate to a flexible display device and, more particularly, to a flexible display device having a structure by which an issue of a crease that can develop during repeated use can be addressed or overcome.

Discussion of Related Art

Recently, in response to the development of the information society and the development of various portable electronic devices such as mobile communication terminals and notebook computers, the importance of display devices as visual information delivery media is being increasingly emphasized.

Recently, a flexible display device fabricated using a flexible material such as plastic, instead of a conventional inflexible glass substrate, to maintain good display performance even when the display device is bent like paper is rapidly emerging as a next-generation display device.

Flexible display devices can be categorized into: unbreakable display devices having high durability characteristics using a plastic substrate instead of a glass substrate, bendable display devices that can be bent without being broken, rollable display devices that can be rolled, foldable display devices that can be folded, and the like. Such flexible display devices can be advantageous in terms of space utilization, interior, and design and have various fields of application.

FIG. 1 is a perspective view illustrating a flexible display device according to a related art.

Referring to FIG. 1, a display panel 11 of a flexible display device 1 can include a folding area configured to display images and be folded at a specific curvature radius. However, if the flexible display panel 11 is repeatedly folded and unfolded during use, the folding area can be stressed and thus can develop a crease L. The crease L of the display panel 11 can reduce visibility, thereby degrading the degree of satisfaction of a user and, furthermore, can cause deterioration in the reliability of a product.

BRIEF SUMMARY OF THE DISCLOSURE

In this regard, the inventors of the present disclosure have invented a flexible display device having a structure by which the limitation of a crease that can develop in a folding area of a display panel can be overcome or effectively addressed.

Embodiments of the present disclosure can provide a flexible display device having a structure able to overcome an issue of a crease that can develop in a folding area, by applying tension to a display panel by using one or more magnetic bodies provided on one or both sides of the display panel.

Embodiments of the present disclosure can provide a flexible display device including: a display panel including at least one folding area foldable about a folding axis and a non-folding area; a cover window provided over the display panel; a back plate supporting a bottom portion of the display panel; a support part supporting the back plate in a slidable manner; a first magnetic body connected to the cover window or the back plate; and a second magnetic body provided on the support part to attract the first magnetic body so that a portion of the second magnetic body connected to the first magnetic body is drawn from the folding area toward the non-folding area.

According to embodiments of the present disclosure, the flexible display device can overcome the limitation of a crease that can develop in the folding area by applying tension to the display panel using the magnetic body or bodies provided on one or both sides of the display panel.

According to embodiments of the present disclosure, it is possible to improve the visibility and product reliability of the flexible display device by overcoming the limitation of a crease that can develop in the folding area.

According to embodiments of the present disclosure, all components can be integrally coupled inside a frame, and thus the flexible display device can be provided as a product in which the components are simplified and unified.

BRIEF DESCRIPTION OF THE DRAWINGS

The above and other objectives, features, and advantages of the present disclosure will be more clearly understood from the following detailed description, taken in conjunction with the accompanying drawings, in which.

DETAILED DESCRIPTION OF THE EMBODIMENTS

Figure 1:
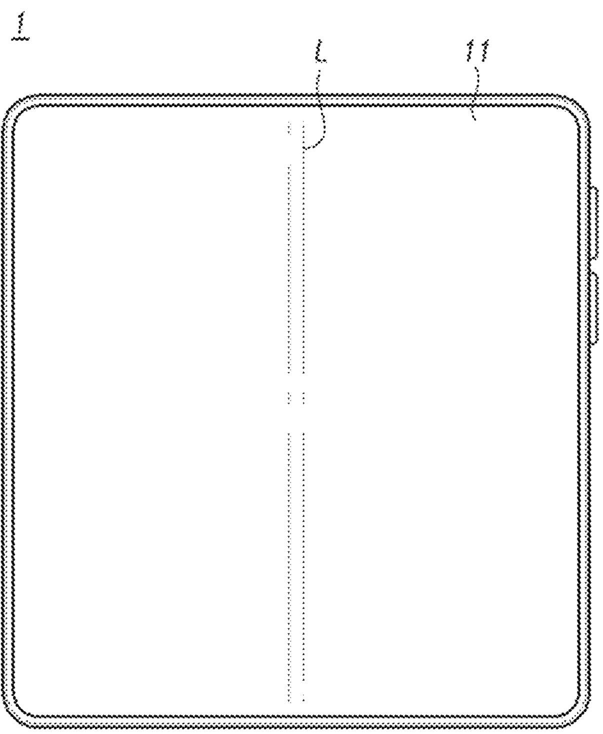
FIG. 1 is a plan diagram illustrating a flexible display device according to a related art.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description can make the subject matter in some embodiments of the present invention rather unclear. The terms such as “including”, “having”, “comprising”, “containing”, “constituting” “make up of”, and “formed of” used herein are generally intended to allow other components to be added unless the terms are used with the term “only”. As used herein, singular forms are intended to include plural forms unless the context clearly indicates otherwise.

Terms, such as “first”, “second”, “A”, “B”, “(A)”, or “(B)” can be used herein to describe elements of the present invention. Each of these terms is not used to define essence, order, sequence, or number of elements etc., but is used merely to distinguish the corresponding element from other elements.

When it is mentioned that a first element “is connected or coupled to”, “contacts or overlaps” etc. a second element, it should be interpreted that, not only can the first element “be directly connected or coupled to” or “directly contact or overlap” the second element, but a third element can also be “interposed” between the first and second elements, or the first and second elements can “be connected or coupled to”, “contact or overlap”, etc. each other via a fourth element. Here, the second element can be included in at least one of two or more elements that “are connected or coupled to”, “contact or overlap”, etc. each other.

Further, in describing a positional relationship where the positional relationship between two parts is described, for example, using “on,” “over,” “under,” “above,” “below,” “beneath,” “near,” “close to,” “adjacent to,” “beside,” or the like, one or more other parts can be located between the two parts unless a more limiting term, such as “immediate(ly)” or “direct(ly).” Furthermore, the terms such as “front,” “rear,” “back,” “left,” “right,” “top,” “bottom,” “downward,” “upward,” “upper,” “lower,” “up,” “down,” “column,” “row,” “vertical,” “horizontal,” and the like refer to an arbitrary frame of reference, unless otherwise specified.

When time relative terms, such as “after”, “subsequent to”, “next”, “before”, and the like, are used to describe processes or operations of elements or configurations, or flows or steps in operating, processing, manufacturing methods, these terms can be used to describe non-consecutive or non-sequential processes or operations unless the term “directly” or “immediately” is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term “may” fully encompasses all the meanings of the term “can”.

Hereinafter a variety of embodiments of the present disclosure will be described in detail with reference to the accompanying drawings. All the components of each flexible display device according to all embodiments of the present disclosure are operatively coupled and configured.

Figure 2:
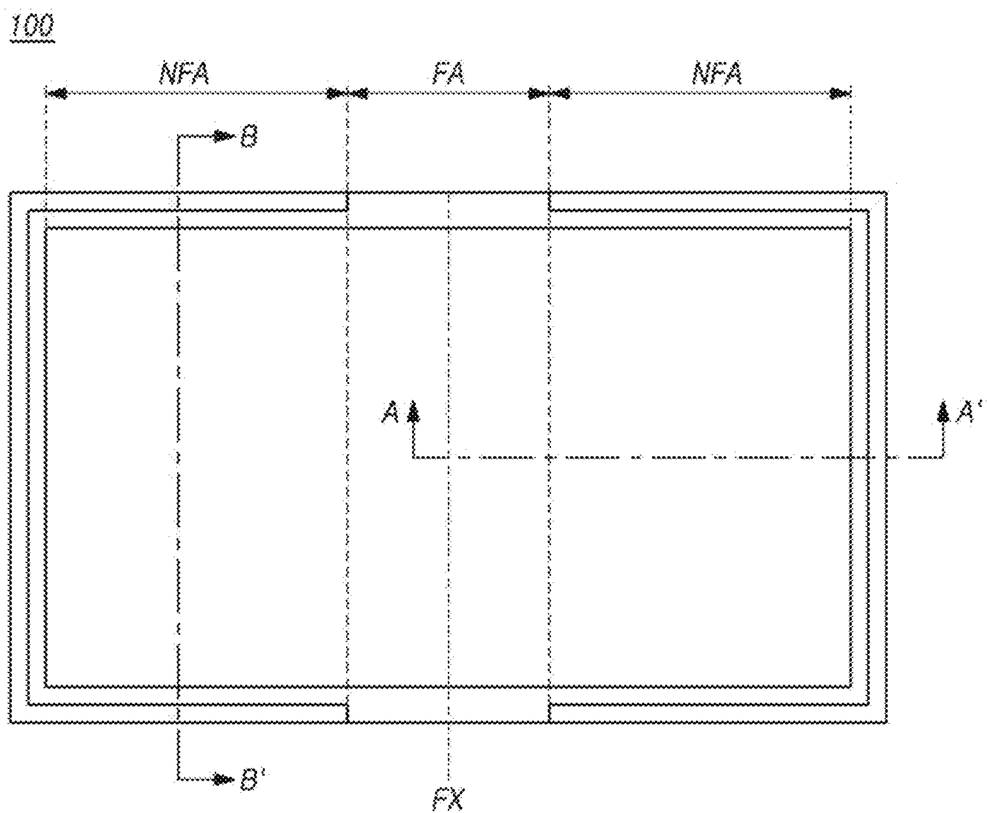
FIG. 2 is a plan diagram illustrating the exterior of a flexible display device according to an embodiment of the present disclosure.
Figure 3:
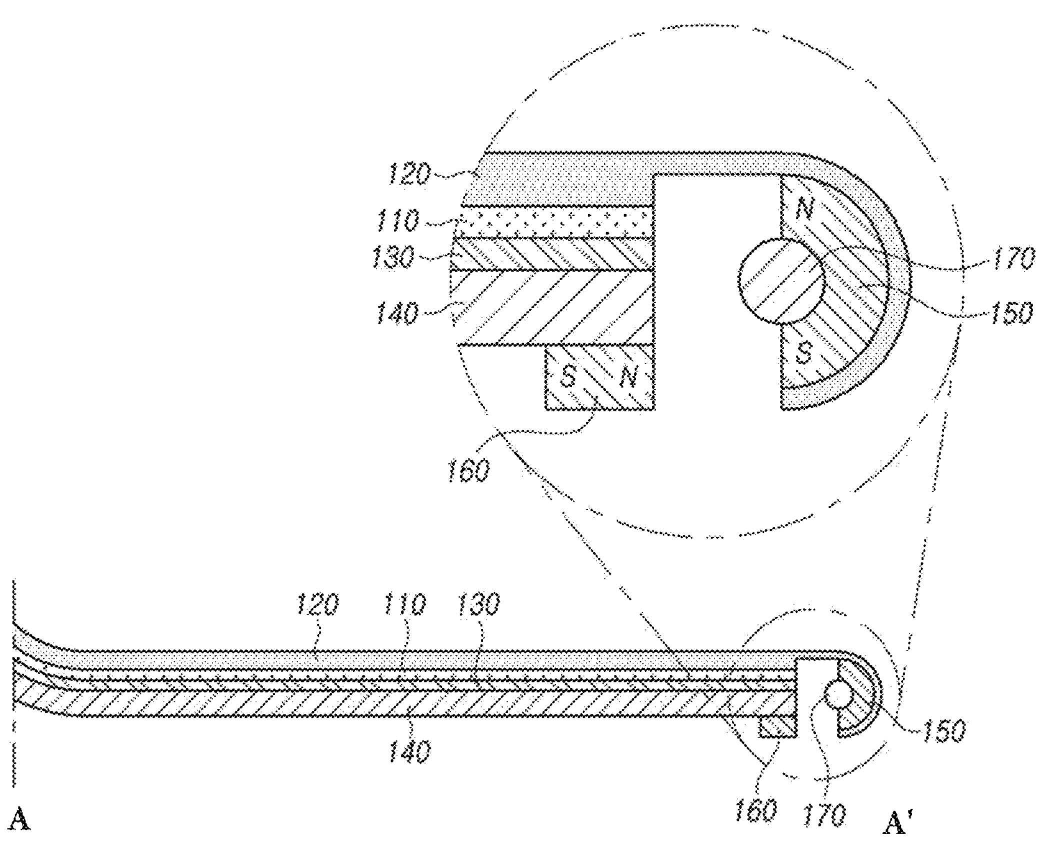
FIG. 3 is a cross-sectional diagram taken along line A-A' in FIG. 2.
Figure 4:
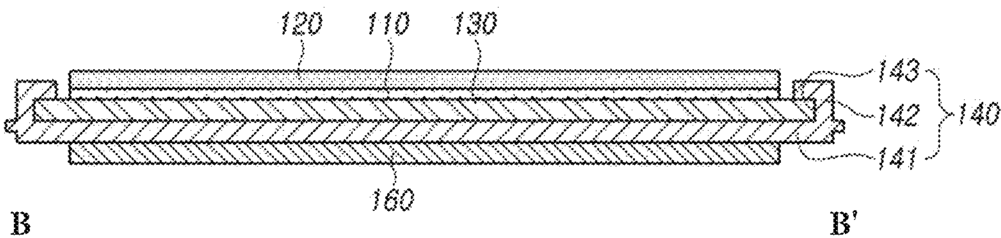
FIG. 4 is a cross-sectional diagram taken along line B-B' in FIG. 2.

FIG. 2 is a plan diagram illustrating the exterior of a flexible display device according to an embodiment of the present disclosure, FIG. 3 is a cross-sectional diagram taken along line A-A' in FIG. 2, and FIG. 4 is a cross-sectional diagram taken along line B-B' in FIG. 2.

Referring to FIGS. 2 to 4, a flexible display device 100 can include a display panel 110, a cover window 120, a back plate 130, a support part 140, a first magnetic body 150, and a second magnetic body 160. Here, the display panel 110, the cover window 120, and the back plate 130 can be bonded to each other through a bonding material such as an optical clear adhesive (OCA).

Hereinafter, embodiments of the present disclosure will be described on the assumption that a display surface of the display panel 110 on which images are displayed is oriented forward, i.e., upward in the drawings, for convenience of description.

The display panel 110 is a panel that displays images. Light-emitting elements for displaying images, circuits for driving the light-emitting elements, conductive lines, components, and the like can be disposed in the display panel 110. For example, the display panel 110 can be one selected from among a liquid crystal display device (LCD), a field emission display device (FED), an electroluminescence display device (ELD), an organic light-emitting diode (OLED) display device, or the like. In embodiments of the present disclosure, the display panel 110 can be implemented using an OLED display device that is representative of a flexible display device able to maintain display performance even when bent like paper.

The OLED display device is a self-light-emitting display device that does not require a backlight used in an LCD that does not emit light by itself, and thus can be lightweight and thin. In addition, the OLED display device has a variety of merits such as a superior viewing angle and contrast ratio compared to those of the LCD, low power consumption, drivability at a low DC voltage, a high response rate, impact resistance to external shocks due to solid internal components, and a wide operation temperature range. In particular, the fabrication cost of the OLED display device can be significantly lower compared to the LCD due to a simple fabrication process.

The display panel 110 can include at least one folding area FA foldable about a folding axis FX and non-folding areas NFA.

The folding area FA is an area in which the flexible display device 100 can be bent. In the folding area FA, the flexible display device 100 can be bent at a specific curvature radius about the folding axis FX.

Although the folding axis FX is illustrated as being disposed at the center (or middle portion) of the display panel 110 in FIG. 2, the position and number of the folding axes FX can be variously modified. In addition, the folding area FA can be variously modified depending on the position and number of the folding axes FX but is not limited thereto.

The non-folding areas NFA are areas in which the display panel 110 is not bent and maintains a flat state. For example, the non-folding areas NFA can extend from both ends (or one or more ends) of the folding area FA. Two non-folding areas NFA can be disposed on both ends of the folding area FA, but other variations are possible. For instance, more than two non-folding areas and/or more than one folding area FA can be provided in a display panel, and the sizes and shapes of the non-folding areas can be different from each other.

When the flexible display device 100 is in an unfolded state, the folding area FA and the non-folding areas NFA can be coplanar. In addition, when the flexible display device 100 is folded about the folding axis FX, the non-folding areas NFA on both ends of the folding area FA can be disposed to face each other while remaining flat.

The cover window 120 is configured to protect the display panel 110 from external shocks and scratches. The cover window 120 can be provided over the display panel 110.

The cover window 120 can be formed of a material having impact resistance and light transmittance. For example, the cover window 120 can be implemented using a glass substrate or a plastic thin film formed of one selected from among polymethyl methacrylate (PMMA), polyimide (PI), polyethylene terephthalate (PET), or combinations thereof.

A hard coating layer can further be provided on one or both surfaces of the cover window 120 in order to improve the surface hardness of the cover window 120.

The back plate 130 is configured to compensate for sagging and strength of the display panel 110, and can support the bottom portion of the display panel 110. For example, the back plate 130 can be implemented using a plastic thin film formed of one selected from among polycarbonate (PC), polyimide (PI), polyethylene naphthalate (PEN), polyethylene terephthalate (PET), or combinations thereof.

As illustrated in FIG. 4, a width of the back plate 130 can be formed to be greater than that of the display panel 110 in the direction of the folding axis FX. Due to this configuration of the back plate 130, both side portions of the back plate 130 can protrude from the display panel 110.

The support part 140 can support the back plate 130 in a slidable manner. For example, the support part 140 can be formed of a plastic material having high hardness so as to maintain a predetermined thickness. Although the material of the support part 140 is not limited, specific metal materials such as Fe, Ni, or Co can be omitted in order not to affect the magnetic bodies 150 and 160 described later.

Specifically, the support part 140 can include a base 141 and guides 142.

The base 141 can have the same shape as the bottom surface of the back plate 130 to support the bottom portion of the back plate 130. For example, the base 141 can have the shape of an oblong plate extending in a direction perpendicular to the folding axis FX.

The guides 142 extend upward from both ends of the base 141 and are elongated in a direction perpendicular to the folding axis FX. Each of the guides 142 can have sliding recesses 143 depressed from the inner surface thereof. The side portions of the back plate 130 protruding from the display panel 110 can be fitted into the sliding recesses 143.

For example, since a width of the back plate 130 is greater than that of the display panel 110 in the direction of the folding axis FX, the both side portions of the back plate 130 can protrude from the display panel 110 and be fitted into the sliding recesses 143 formed in the inner surfaces of the guides 142. Thus, the back plate 130 can be linearly moved along with the sliding recesses 143 by magnetic force of the first magnetic body 150 and the second magnetic body 160 described later.

The first magnetic body 150 can be connected to the cover window 120 or the back plate 130. In embodiments of the present disclosure, the first magnetic body 150 will be described as being connected to the cover window 120.

The first magnetic body 150 can be implemented as a (strong) permanent magnet, and can be connected to one or both sides (or multiple sides) of the cover window 120. For example, the first magnetic body 150 can be implemented as a horseshoe magnet, and can be pivotably connected to the cover window 120 by means of a rotating bar 170. However, the present disclosure is not limited thereto. The first magnetic body 150 can have other shapes. For example, the first magnetic body 150 can have a half ring shape in a cross-sectional view. Details thereof will be described later.

The second magnetic body 160 is provided on the support part 140. The second magnetic body 160 can attract the first magnetic body 150 so that a portion of the second magnetic body 160 connected to the first magnetic body 150 can be drawn in the direction of one of the non-folding areas NFA from the folding area FA. For example, the second magnetic body 160 can be implemented as a strong permanent magnet like the first magnetic body 150. The second magnetic body 160 can have the shape of a bar magnet elongated in the direction of the folding axis FX and thus be fixed to the bottom of one side or the bottoms of both sides of the support part 140.

Figure 5:
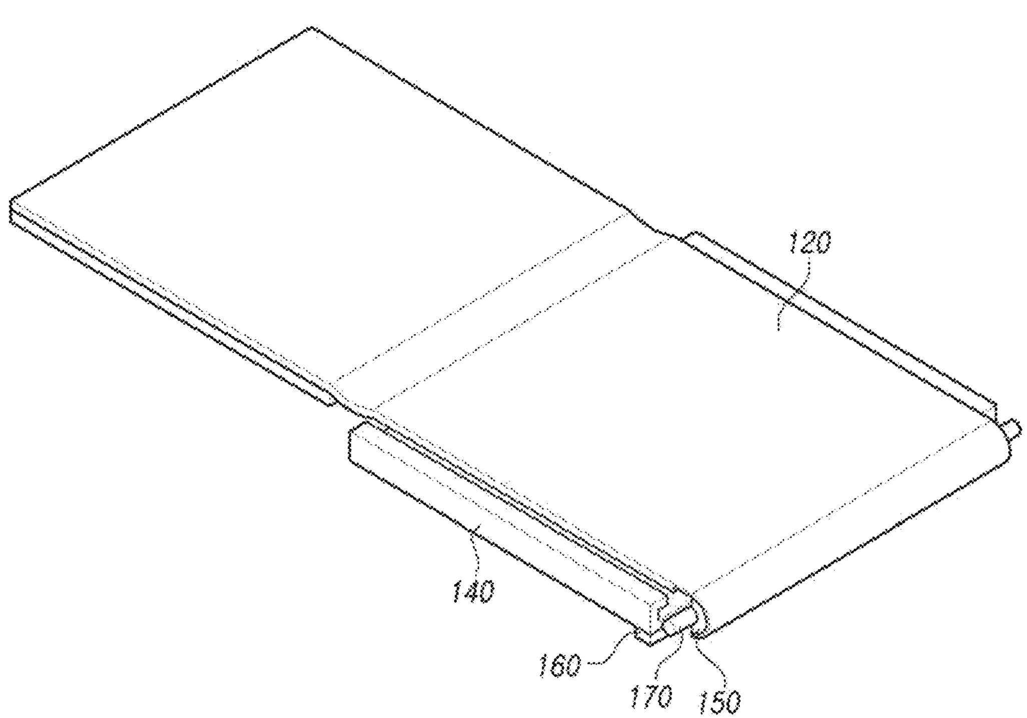
FIG. 5 is a perspective diagram illustrating an internal configuration of the flexible display device according to an embodiment of the present disclosure.
Figure 6:
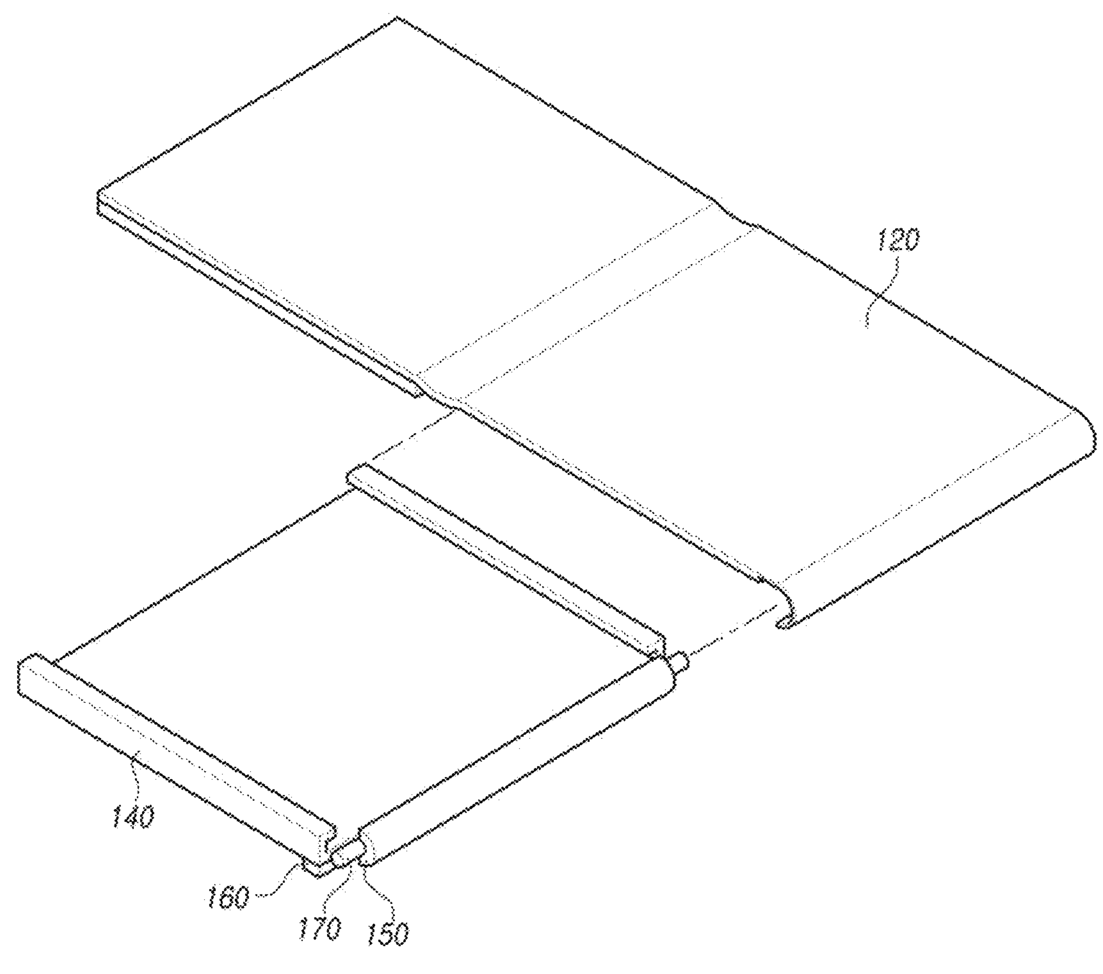
FIG. 6 is an exploded perspective diagram of FIG. 5.

FIG. 5 is a perspective diagram illustrating an internal configuration of the flexible display device according to an embodiment of the present disclosure, and FIG. 6 is an exploded perspective diagram of FIG. 5.

Referring to FIGS. 5 and 6, one or both sides of the cover window 120 in a direction perpendicular to the folding axis FX can be connected to the first magnetic body 150. For example, the cover window 120 can be formed to be greater than display panel 110 in the direction perpendicular to the folding axis FX. Thus, one side (or both sides) of the cover window 120 can protrude from the display panel 110, and the cover window 120 can be fixed to the first magnetic body 150 with the protruding portion thereof surrounding the outer circumferential surface of the first magnetic body 150. Here, the cover window 120 can be fixed to the first magnetic body 150 through an adhesive.

As a variation, the number of the first magnetic bodies 150 can correspond to the number of the second magnetic bodies 160. For example, when a single second magnetic body 160 is provided on the bottom of one side of the support part 140, a single first magnetic body 150 can be connected to one side of the cover window 120. When two second magnetic bodies 160 are provided on the bottoms of both sides of the support part 140, two first magnetic bodies 150 can be connected to both sides of the cover window 120. If more than two first magnetic bodies are provided, then the same number of second magnetic bodies can be provided.

Figure 7:
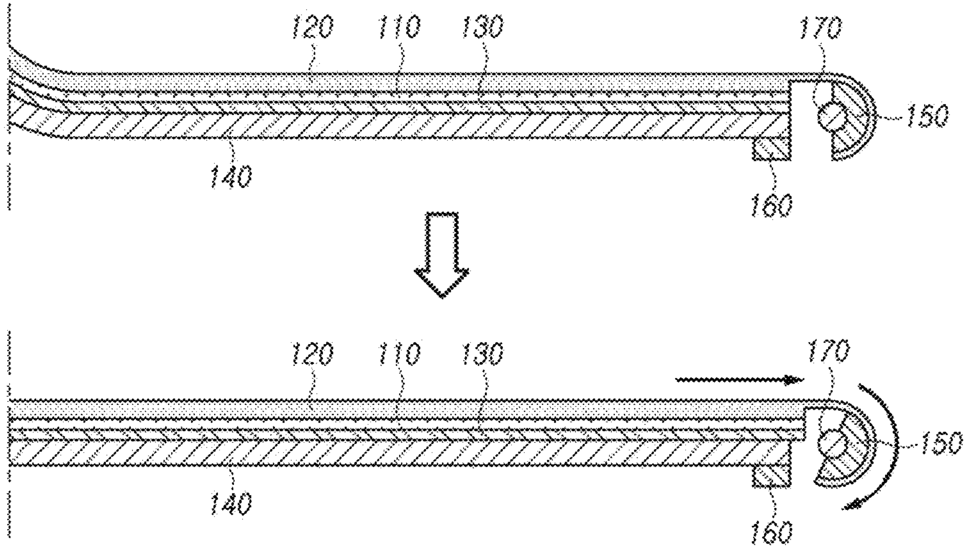
FIG. 7 is a diagram schematically illustrating an operation of unfolding the flexible display device according to an embodiment of the present disclosure from a folded state.

FIG. 7 is a diagram schematically illustrating an operation of unfolding the flexible display device according to an embodiment of the present disclosure from a folded state.

Referring to FIG. 7, the first magnetic body 150 can be pivotably connected to the cover window 120. For example, the first magnetic body 150 can be elongated in the direction of the folding axis FX, spaced apart from the second magnetic body 160, and connected to a cylindrical rotating bar 170 pivotably supporting the first magnetic body 150. Thus, the first magnetic body 150 can pivot due to the magnetic attraction of the second magnetic body 160.

Specifically, the first magnetic body 150 can be elongated in the direction of the folding axis FX and can have the shape of a horseshoe magnet surrounding a portion of the outer circumferential surface of the rotating bar 170. However, the present disclosure is not limited thereto. For example, a magnetic body holder having a shape of a horseshoe magnet surrounding a portion of the outer circumferential surface of the rotating bar 170 can be provided, and the first magnetic body 150 can be attached to an end of the magnetic body holder facing the second magnetic body 160.

In another embodiment of the present disclosure, the magnetic body holder can have a half ring shape in a cross-sectional view. For example, the magnetic body holder can have a half ring shape cross-sectional. In another embodiment of the present disclosure, the first magnetic body 150 can be embedded into the magnetic body holder while an end thereof facing the second magnetic body 160 is exposed. In addition, the second magnetic body 160 can be provided in the shape of a bar magnet elongated in the direction of the folding axis FX, and can be disposed below one or both sides of the support part 140. Here, ends of the first magnetic body 150 and the second magnetic body 160 facing each other can be disposed to have different polarities.

Thus, attractive force is generated between the first magnetic body 150 and the second magnetic body 160 so that the first magnetic body 150 and the second magnetic body 160 attract each other. As a result, the cover window 120 connected to the first magnetic body 150 can be pulled from the folding area FA toward the non-folding areas NFA, thereby smoothing or removing the crease of the folding area FA. In addition, the top portion of the first magnetic body 150 is provided with the same polarity as the polarity of the surface facing the second magnetic body 160. Thus, the rotating bar 170 can rotate to a predetermined angle instead of rotating 360° to pull the cover window 120. The angle of rotation of the second magnetic body 160 can be set differently depending on the length of the first magnetic body 150.

The cover window 120 can be connected to the first magnetic body 150 and the rotating bar 170. In addition, the rotating bar 170 can be formed of a non-magnetic material so as not affect the magnetic force generated between the first magnetic body 150 and the second magnetic body 160.

Figure 8:
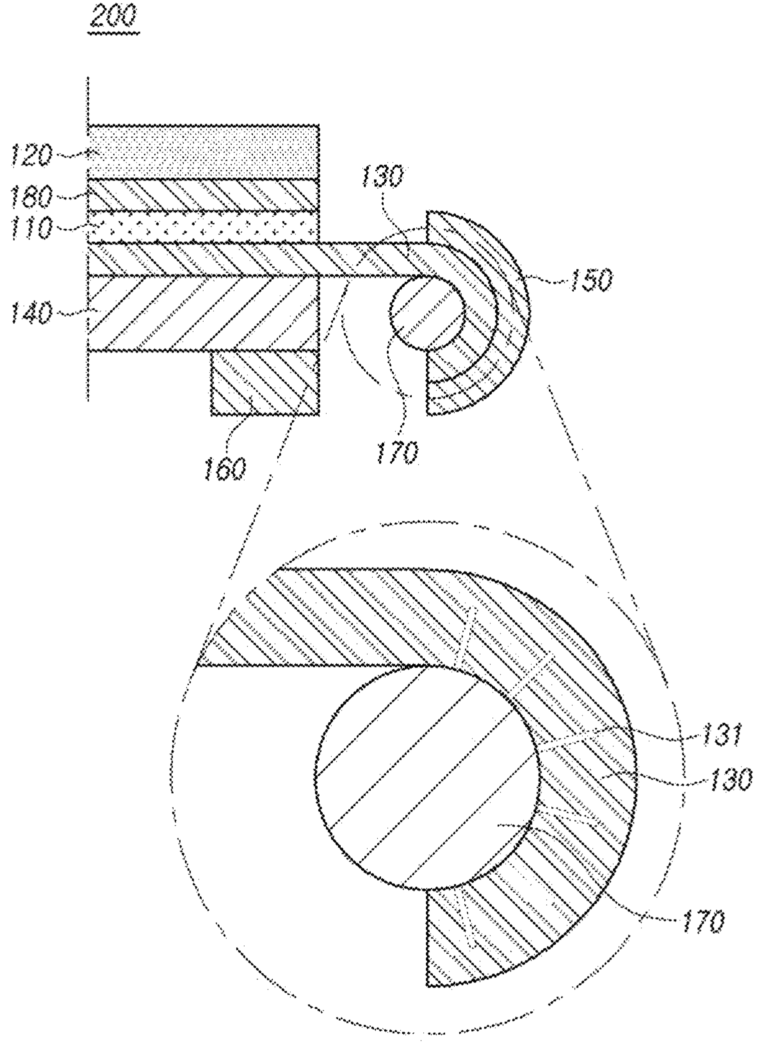
FIG. 8 is a cross-sectional diagram illustrating a flexible display device according to another embodiment of the present disclosure.

FIG. 8 is a cross-sectional diagram illustrating a flexible display device according to another embodiment of the present disclosure. Features of the present embodiment different from those of the foregoing embodiment will be mainly described.

Referring to FIG. 8, a flexible display device 200 can include a display panel 110, a cover window 120, a back plate 130, a support part 140, a first magnetic body 150, a second magnetic body 160, a rotating bar 170, and a polarization layer 180. Here, descriptions of the display panel 110 and the cover window 120 will be omitted, since the configurations thereof are the same as those described above.

One or both sides of the cover window 120 can be connected to the first magnetic body 150. For example, the cover window 120 is connected to the first magnetic body 150 in the foregoing embodiment, while the back plate 130, rather than the cover window 120, can be connected to the first magnetic body 150 in the present embodiment. The cover window 120, the display panel 110, and the back plate 130 are bonded to each other by the adhesive even in the case that the back plate 130 is connected to the first magnetic body 150, the crease formed in the folding area FA can be smoothed or removed by the magnetic force of the first magnetic body 150 and the second magnetic body 160 in a way as described above.

A length of the back plate 130 can be formed to be greater than that of the display panel 110 in a direction perpendicular to the folding axis FX. Thus, one or both side portions of the back plate 130 can protrude from the display panel 110, and the outer circumferential surface of the first magnetic body 150 or the outer circumferential surface of the rotating bar 170 can be surrounded and fixed by the protruding end portion of the back plate 130. When the back plate 130 is configured to surround the outer circumferential surface of the rotating bar 170, the first magnetic body 150 can be coupled to the outer circumferential surface of the back plate 130 surrounding the rotating bar 170. Here, the rotating bar 170, the back plate 130, and the first magnetic body 150 can be bonded by the adhesive.

The end portion of the back plate 130 is fixed while having a shape surrounding the outer circumferential surface of the first magnetic body 150 or the rotating bar 170. A plurality of grooves (or slots) 131 having a predetermined pattern can be provided in a portion of the back plate 130 connected to the first magnetic body 150. Due to this configuration of the grooves 131, the back plate 130 can be properly deformed without being damaged and thus be more easily coupled to the rotating bar 170. Although the grooves 131 are illustrated as being provided in the inner circumferential surface of the back plate 130 in the present embodiment, the grooves 131 can be provided in the outer circumferential surface of the back plate 130.

The polarization layer 180 is configured to reduce the reflection of external light that is incident on the display panel 110 by selectively allowing light to pass therethrough, and can be disposed between the cover window 120 and the display panel 110. For example, the polarization layer 180 can be formed of polyvinyl alcohol (PVA), polycarbonate (PC), poly(methyl methacrylate) (PMMA), or the like.

The first magnetic body 150 can be connected to the display panel 110 or the polarization layer 180. However, for convenience of description, in the following embodiments, the cover window 120 will be described as being connected to the first magnetic body 150.

Figure 9:
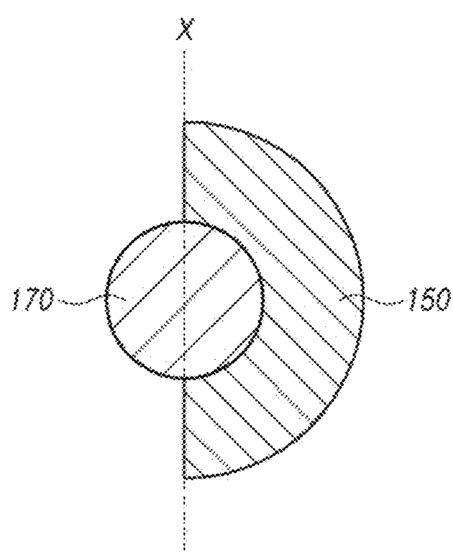
FIG. 9 is a cross-sectional diagram illustrating the first magnetic body according to an embodiment of the present disclosure.

FIG. 9 is a cross-sectional diagram illustrating the first magnetic body according to an embodiment of the present disclosure.

Referring to FIGS. 3 and 9, the first magnetic body 150 can be disposed such that one end thereof faces the display panel 110 and the other end (or another end) thereof faces the second magnetic body 160 while not extending beyond the central axis of the rotating bar 170.

For example, the first magnetic body 150 having the shape of a horseshoe magnet can be configured such that the angle between one end and the other end thereof is not greater than 180°. This is intended to prevent the distal portion of the first magnetic body 150 from coming into contact with the second magnetic body 160 when the first magnetic body 150 is caused to pivot in the direction of the second magnetic body 160 by the magnetic attraction between the first magnetic body 150 and the second magnetic body 160.

In order to more reliably prevent the first magnetic body 150 from coming into contact with the second magnetic body 160, the distance between the first magnetic body 150 and the second magnetic body 160 can be set to be greater than a sum of the radius of the rotating bar 170 and the thickness of the first magnetic body 150 and can be set to be narrower or less than a sum of the diameter of the rotating bar 170 and the thickness of the first magnetic body 150.

Figure 10:
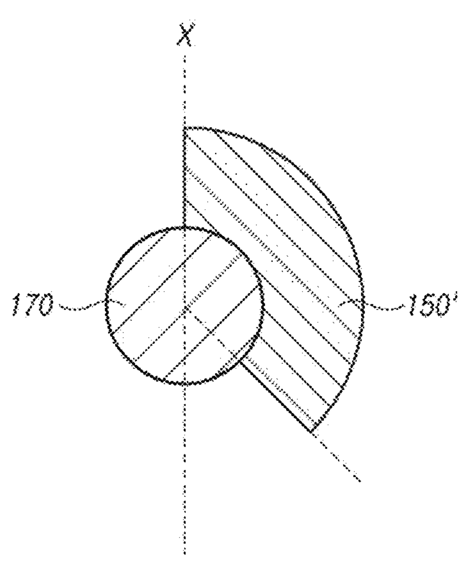
FIG. 10 is a cross-section diagram illustrating the first magnetic body according to another embodiment of the present disclosure.

FIG. 10 is a cross-section diagram illustrating the first magnetic body according to another embodiment of the present disclosure. Features of the present embodiment different from those of the foregoing embodiment will be mainly described.

Referring to FIG. 10, a first magnetic body 150' having the shape of a horseshoe magnet can be configured such that the angle between one end and the other end thereof is narrower than 180°. More specifically, the angle between one end and the other end of the first magnetic body 150' can be in the range of 135° to 180° about the central axis X of the rotating bar 170. This is because when the angle between one end and the other end of the first magnetic body 150' is less than 135°, the first magnetic body 150' may not be properly coupled to the rotating bar 170 and thus can be released from the rotating bar 170.

Figure 11:
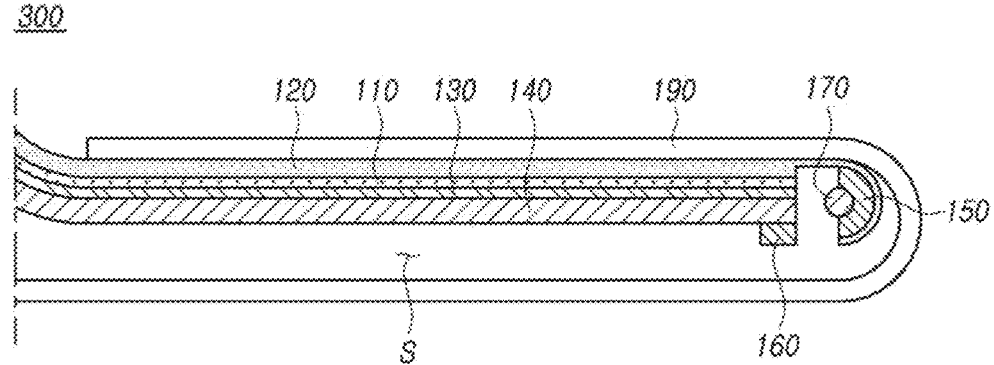
FIG. 11 is a cross-sectional diagram illustrating a portion of a flexible display device according to another embodiment of the present disclosure.

FIG. 11 is a cross-sectional diagram illustrating a portion of a flexible display device according to another embodiment of the present disclosure. Features of the present embodiment different from those of the foregoing embodiment will be mainly described.

Referring to FIG. 11, a flexible display device 300 can further include a cover 190 configured to surround a portion of the display panel 110 except for a surface on which images are displayed. For example, the cover 190 forms the exterior of the flexible display device 300, and can be configured to surround the entire surfaces of the display panel 110 except for a display surface on which images are displayed.

Within the cover 190, the cover window 120, the display panel 110, the back plate 130, and the support part 140 can be sequentially stacked in the top-to-bottom direction. In addition, an accommodation space S can be formed between the support part 140 and the cover 190 to accommodate a battery and a circuit.

In addition, the rotating bar 170 can be pivotably supported within the cover 190. For example, the rotating bar 170 can have the shape of a cylinder with both ends thereof being dome-shaped. The rotating bar 170 can be pivotably coupled to the cover 190 by fitting the rotating bar 170 into a coupling recess formed in the inner surface of the cover 190. When both ends of the rotating bar 170 are dome-shaped, the rotating bar 170 having this structure can more smoothly pivot within the cover 190 than a structure having flat ends.

Figure 12:
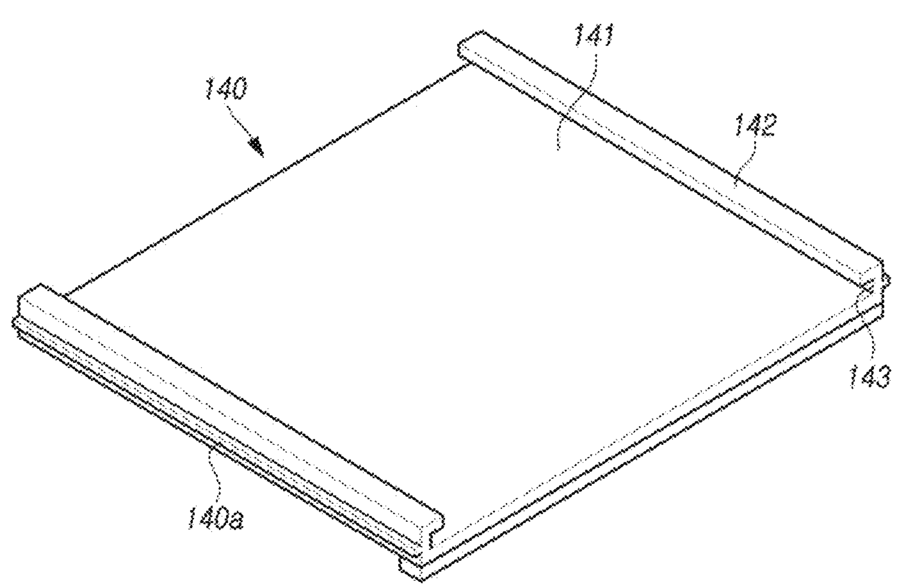
FIG. 12 is a perspective view illustrating the support part according to an embodiment of the present disclosure.

FIG. 12 is a perspective view illustrating the support part according to an embodiment of the present disclosure.

Referring to FIG. 12, the support part 140 can include rails 140*a* protruding from both side portions and elongated in a direction perpendicular to the folding axis FX. The rails 140*a* of the support part 140 can be slid into and coupled to the cover 190.

For example, the rails 140*a* can protrude outward from both side portions of the guides 142. The cover 190 can have rail grooves formed in surface portions facing the rails 140*a* to allow the rails 140*a* to be inserted thereinto. Thus, the rails 140*a* of the support part 140 can be slid into and coupled to the rail grooves of the cover 190.

Figure 13:
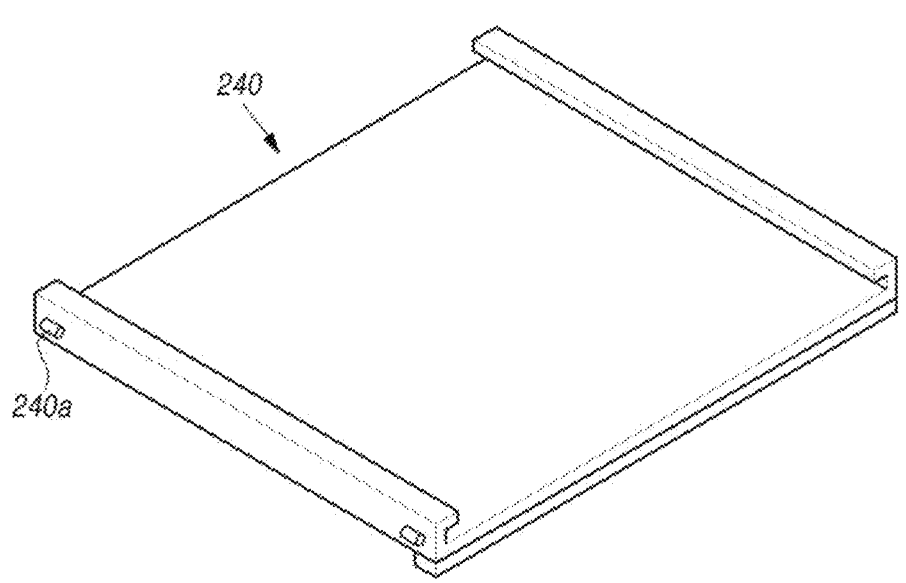
FIG. 13 is a perspective view illustrating a support part according to another embodiment of the present disclosure.

FIG. 13 is a perspective view illustrating a support part according to another embodiment of the present disclosure.

Referring to FIG. 13, a support part 240 can include coupling protrusions 240*a* provided on both side portions thereof. Here, at least two coupling protrusions 240*a* are formed on each side portion and the coupling protrusions 240*a* are spaced apart from each other. The coupling protrusions 240*a* of the support part 140 can be interference-fitted with the cover 190.

For example, the coupling protrusions 240*a* can have the shape of a hemisphere or a dome. A pair of such coupling protrusions 240*a* can be disposed on one or both of the guides 142 to be spaced apart from each other. In addition, the cover 190 can have coupling recesses formed in surface portions facing the coupling protrusions 240*a* to allow the coupling protrusions 240*a* to be inserted thereinto. Thus, the coupling protrusions 240*a* of the support part 140 can be interference-fitted with the coupling recesses of the cover 190.

Figure 14:
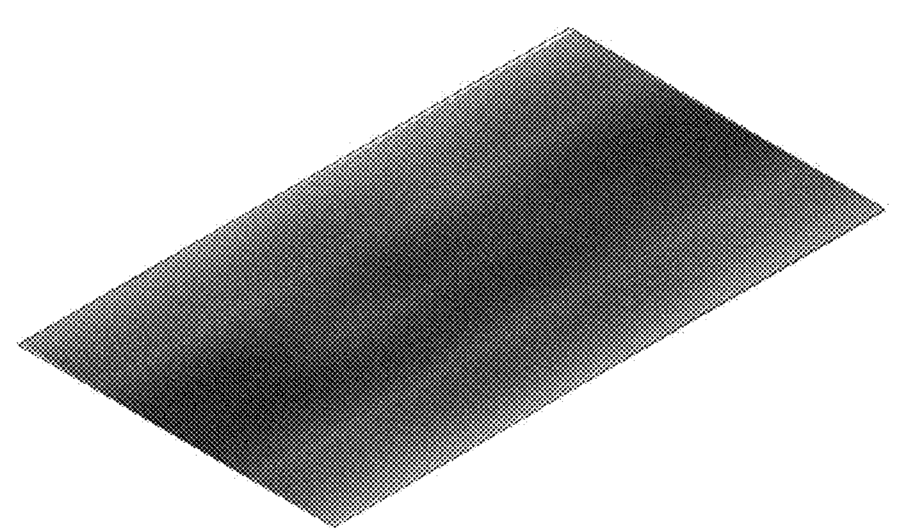
FIG. 14 is an image obtained by measuring the height in a folding area of a flexible display device of a related art.

FIG. 14 is an image obtained by measuring the height in a folding area of a flexible display device of a related art. Specifically, FIG. 14 illustrates an image obtained by measuring the height in a folding area FA of a flexible display device 1 of the related art (i.e., without the first magnetic body 150 or the second magnetic body 160 of the present disclosure). In this example, a test was performed by repeatedly bending the flexible display device 1,000 times. The size of the red-colored highest areas is 0.12 mm, while the size of the blue-colored lowest area is 0.3044 mm. Thus, the difference between the maximum value and the minimum value is 0.4244 mm.

Figure 15:
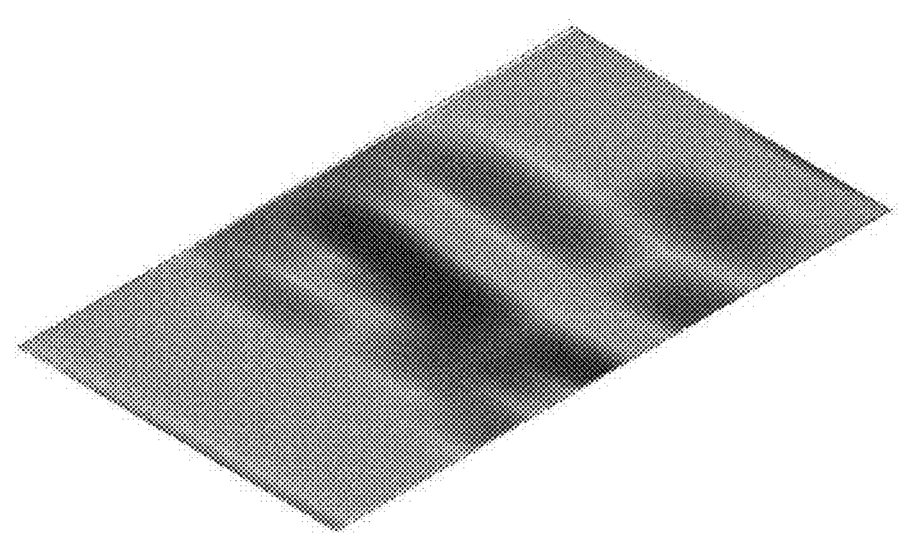
FIG. 15 is an example of an image obtained by measuring the height in a folding area in which a first magnetic body is only connected to one side of a cover window.

FIG. 15 is an example of an image obtained by measuring the height in a folding area in which a first magnetic body is only connected to one side of a cover window according to an aspect of the present disclosure.

Specifically, FIG. 15 illustrates an image in a state in which the first magnetic body 150 and the second magnetic body 160 of the present disclosure are only provided on one side of the cover window 120 and thus only one side of the cover window 120 is pulled by magnetic attraction. In the present example, a bending test was performed by repeatedly bending the flexible display device 100 1,000 times. The size of the red-colored highest areas is 0.034 mm, while the size of the blue-colored lowest areas is 0.089 mm. Thus, the difference between the maximum value and the minimum value is 0.123 mm.

Figure 16:
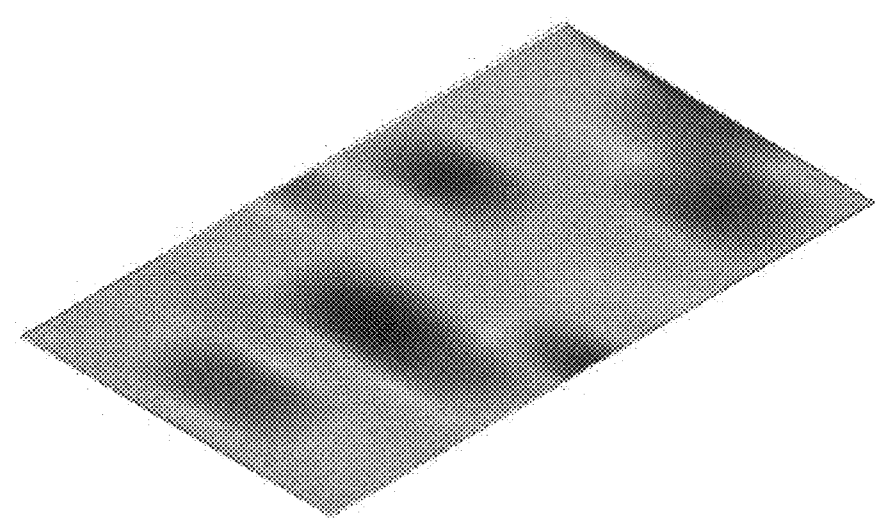
FIG. 16 is an example of an image obtained by measuring the height in a folding area in a state in which a first magnetic body is connected to both sides of a cover window.

FIG. 16 is an example of an image obtained by measuring the height in a folding area in a state in which a first magnetic body is connected to both sides of a cover window according to an aspect of the present disclosure.

Specifically, FIG. 16 illustrates an image in a state in which the first magnetic body 150 and the second magnetic body 160 of the present disclosure are provided on both sides of the cover window 120 and thus the both sides of the cover window 120 are pulled by magnetic attraction. In the present example, a bending test was performed by repeatedly bending the flexible display device 100 1,000 times. The size of the red-colored highest areas is 0.018 mm, while the size of the blue-colored lowest areas is 0.016 mm. Thus, the difference between the maximum value and the minimum value is 0.034 mm.

The smaller the difference between the highest areas and the lowest areas of the folding area FA in the flexible display device 100 is, the less the crease can be formed. Thus, referring to the test results of FIGS. 14 to 16, it can be viewed that the crease was more effectively removed when tension was applied to one side of the display panel 110 by means of the first magnetic body 150 and the second magnetic body 160, compared to the related-art example in which neither the first magnetic body nor the second magnetic body is provided.

In addition, it can be seen that the crease was more effectively removed when tension was applied to both sides of the display panel than when tension was applied to one side of the display panel by means of the first magnetic body and the second magnetic body of the present disclosure.

Some examples of the present disclosure will be briefly reviewed as follows.

One or more examples of the present disclosure can provide a flexible display device including: a display panel including at least one folding area foldable about a folding axis and a non-folding area; a cover window provided over the display panel; a back plate supporting a bottom portion of the display panel; a support part supporting the back plate in a slidable manner; a first magnetic body connected to the cover window or the back plate; and a second magnetic body provided on the support part to attract the first magnetic body so that a portion of the second magnetic body connected to the first magnetic body can be drawn from the folding area toward the non-folding area.

In the flexible display device, the first magnetic body can be connected to one or more sides of the cover window or back plate.

In the flexible display device, surfaces of the first magnetic body and the second magnetic body facing each other can be configured to have different polarities.

In the flexible display device, the first magnetic bodies and the second magnetic bodies can be provided, with the number of the first magnetic bodies corresponding to the number of the second magnetic bodies. The first magnetic body can be configured to be pivotable at a position at which the first magnetic body is not attached to the second magnetic body.

In the flexible display device, the cover window or the back plate can have a predetermined pattern of a plurality of grooves (or slots) in a portion thereof connected to the first magnetic body.

In the flexible display device, the back plate can have a size greater than a size of the display panel in the direction of the folding axis.

In the flexible display device, the support part can include abase supporting the bottom portion of the back plate, and guides extending upward from ends of the base and elongated in a direction perpendicular to the folding axis FX. Each of the guides can have sliding recesses depressed from the inner surface thereof. The sliding recesses allow side portions of the back plate protruding from the display panel to be fitted thereinto.

In the flexible display device, the cover window or the back plate connected to the first magnetic body can have a size greater than a size of the display panel in the direction perpendicular to the folding axis.

In the flexible display device, the first magnetic body can be connected to a protrusion of the cover window or the back plate, the protrusion protruding beyond the display panel.

In the flexible display device, the second magnetic body can have the shape of a bar magnet elongated in the direction of the folding axis FX, and can be disposed below one or both sides of the support part.

The flexible display device can further include a cylindrical rotating bar elongated in a direction of the folding axis and pivotably supporting the first magnetic body.

In the flexible display device, the rotating bar can be formed of a non-magnetic material.

The flexible display device can further include a cover configured to surround a portion of the display panel except for a surface on which images are displayed. The rotating bar can be pivotably supported within the cover.

In the flexible display device, the cover window or the back plate can be connected to an outer circumferential surface of the first magnetic body or between the rotating bar and the first magnetic body.

In the flexible display device, the first magnetic body can be elongated in the direction of the folding axis and can have the shape of a horseshoe magnet surrounding a portion of the outer circumferential surface of the rotating bar.

In the flexible display device, the first magnetic body can be configured such that one end thereof faces the display panel and the other end (or another end) thereof faces the second magnetic body while not extending beyond the central axis of the rotating bar.

In the flexible display device, the angle between one end and the other end of the first magnetic body can be in the range of 135° to 180° about the central axis X of the rotating bar.

In the flexible display device, the distance between the first magnetic body and the second magnetic body can be set to be greater than a sum of the radius of the rotating bar and the thickness of the first magnetic body and can be set to be less than a sum of the diameter of the rotating bar and the thickness of the first magnetic body.

The flexible display device can further include a polarization layer disposed between the cover window and the display panel. The first magnetic body can be connected to one selected from among the cover window, the back plate, and the polarization layer.

Another example of the flexible display device can include a display panel including at least one folding area foldable about a folding axis and a non-folding area; a cover window provided over the display panel; a polarization layer disposed between the cover window and the display panel; a back plate supporting a bottom portion of the display panel; a support part supporting the back plate in a slidable manner; a first magnetic body connected to one selected from among the display panel, the cover window, the polarization layer, and the back plate; and a second magnetic body provided on the support part to attract the first magnetic body so that a portion of the second magnetic body connected to the first magnetic body can be drawn from the folding area toward the non-folding area.

Another example of the flexible display device can include a display panel comprising at least one folding area that is foldable about a folding axis and a non-folding area; a back plate provided under the display panel and supporting the display panel; a rotating bar provided at an outer side the display panel parallel to the folding axis, a magnetic body holder fixed on the rotating bar and connected to the back plate, a first magnetic body; and a second magnetic body provided at a bottom of the back plate and close to the rotating bar, wherein the first magnetic body is fixed to an end part of the magnetic body holder facing the second magnetic body, wherein ends of the first magnetic body and the second magnetic body facing each other have different polarities.

In the flexible display device, wherein the first magnetic body is embedded into the magnetic body holder while the end part thereof facing the second magnetic body is exposed.

In the flexible display device, wherein the magnetic body holder has a cross-section having a half ring shape.

In the flexible display device, further comprising a cover window provided on the display panel.

In the flexible display device, further comprising a support part supporting the back plate in a slidable manner.

In the flexible display device, wherein a rotating bar and magnetic body holders are provided at two sides of the display panel parallel to the folding axis, and wherein the magnetic body holders at the two sides of the display panel are respectively connected to both sides of the back plate.

According to the embodiments of the present disclosure, it is possible to overcome the limitation of a crease that can develop in the folding area, by applying tension to the display panel using the magnetic body or bodies provided on one or more sides of the display panel.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. The above description and the accompanying drawings provide an example of the technical idea of the present invention for illustrative purposes only. For example, the disclosed embodiments are intended to illustrate the scope of the technical idea of the present invention.

What is claimed is:

1. A flexible display device comprising:

a display panel comprising at least one folding area that is foldable about a folding axis and a non-folding area;

a cover window provided on the display panel;

a back plate provided under the display panel and supporting the display panel;

a support part supporting the back plate in a slidable manner;

a first magnetic body connected to the cover window or the back plate; and a second magnetic body provided on the support part to attract the first magnetic body so that a portion of the second magnetic body connected to the first magnetic body is drawn from the folding area toward the non-folding area.

2. The flexible display device according to claim 1, wherein the first magnetic body is connected to one or more sides of the cover window or back plate.

3. The flexible display device according to claim 1, wherein a plurality of the first magnetic bodies and a plurality of the second magnetic bodies are provided, a number of the first magnetic bodies corresponds to a number of the second magnetic bodies, and one of the first magnetic bodies is pivotable at a position at which that one first magnetic body is not attached to one of the second magnetic bodies.

4. The flexible display device according to claim 1, wherein the cover window or the back plate has a predetermined pattern of a plurality of grooves in a portion thereof connected to the first magnetic body.

5. The flexible display device according to claim 1, wherein the back plate has a size greater than a size of the display panel in a direction of the folding axis.

6. The flexible display device according to claim 5, wherein the support part comprises:

a base supporting a bottom portion of the back plate; and guides extending upward from ends of the base and being elongated in a direction perpendicular to the folding axis, each of the guides having sliding recesses depressed from the inner surface thereof, and the sliding recesses allowing side portions of the back plate protruding from the display panel to be fitted thereinto.

7. The flexible display device according to claim 1, wherein the cover window or the back plate connected to the first magnetic body has a size than greater a size of the display panel in a direction perpendicular to the folding axis.

8. The flexible display device according to claim 7, wherein the first magnetic body is connected to a protrusion of the cover window or the back plate, the protrusion protruding beyond the display panel.

9. The flexible display device according to claim 1, wherein the second magnetic body has a shape of a bar magnet elongated in a direction of the folding axis, and is provided below one or more sides of the support part.

10. The flexible display device according to claim 1, further comprising a rotating bar elongated in a direction of the folding axis and pivotably supporting the first magnetic body.

11. The flexible display device according to claim 10, wherein the rotating bar comprises a non-magnetic material.

12. The flexible display device according to claim 10, further comprising a cover surrounding a portion of the display panel except for a surface on which images are displayed, wherein the rotating bar is pivotably supported within the cover.

13. The flexible display device according to claim 10, wherein the cover window or the back plate is connected to an outer circumferential surface of the first magnetic body or between the rotating bar and the first magnetic body.

14. The flexible display device according to claim 10, wherein the first magnetic body is elongated in the direction of the folding axis and has a shape of a horseshoe magnet surrounding a portion of an outer circumferential surface of the rotating bar.

15. The flexible display device according to claim 14, wherein one end of the first magnetic body faces the display panel and another end of the first magnetic body faces the second magnetic body while not extending beyond a central axis of the rotating bar.

16. The flexible display device according to claim 14, wherein an angle between one end and another end of the first magnetic body is in a range of about 135° to 180° with respect to a central axis of the rotating bar.

17. The flexible display device according to claim 10, wherein a distance between the first magnetic body and the second magnetic body is set to be greater than a sum of a radius of the rotating bar and a thickness of the first magnetic body, and is set to be less than a sum of a diameter of the rotating bar and the thickness of the first magnetic body.

18. The flexible display device according to claim 1, further comprising a polarization layer provided between the cover window and the display panel, wherein the first magnetic body is connected to one selected from among the cover window, the back plate, and the polarization layer.

19. A flexible display device comprising:

a display panel comprising at least one folding area that is foldable about a folding axis and a non-folding area;

a cover window provided on the display panel;

a polarization layer provided between the cover window and the display panel;

a back plate provided under the display panel and supporting the display panel;

a support part supporting the back plate in a slidable manner;

a first magnetic body connected to one selected from among the display panel, the cover window, the polarization layer, and the back plate; and a second magnetic body provided on the support part to attract the first magnetic body so that a portion of the second magnetic body connected to the first magnetic body is drawn from the folding area toward the non-folding area.

* * * * *